(12) United States Patent
Liu et al.

(10) Patent No.: US 7,264,381 B2
(45) Date of Patent: Sep. 4, 2007

(54) LIGHT EMITTING DIODE ASSEMBLY USING ALTERNATING CURRENT AS THE POWER SOURCE

(75) Inventors: Chia-Chi Liu, Taipei (TW); Chih-Sheng Chan, Taipei (TW)

(73) Assignee: Lustrous Technology Ltd., Taipei (TW)

( * ) Notice: Subject to any disclaimer, the term of this patent is extended or adjusted under 35 U.S.C. 154(b) by 0 days.

(21) Appl. No.: 11/271,786

(22) Filed: Nov. 14, 2005

(65) Prior Publication Data

US 2006/0138969 A1   Jun. 29, 2006

(30) Foreign Application Priority Data

Dec. 24, 2004   (TW)   ............................... 93140579 A

(51) Int. Cl.
*F21V 17/00*   (2006.01)
*H01L 27/15*   (2006.01)

(52) U.S. Cl. ...................... 362/364; 362/158; 362/186; 362/243; 362/800; 257/81; 257/98; 257/99

(58) Field of Classification Search ................ 362/158, 362/800, 186, 243, 364, 801, 806; 257/81, 257/98, 99; 315/185 S, 312, 200 A
See application file for complete search history.

(56) References Cited

U.S. PATENT DOCUMENTS

| | | | | |
|---|---|---|---|---|
| 3,869,641 | A * | 3/1975 | Goldberg | 315/135 |
| 4,271,408 | A * | 6/1981 | Teshima et al. | 345/83 |
| 4,939,426 | A * | 7/1990 | Menard et al. | 315/192 |
| 5,187,377 | A * | 2/1993 | Katoh | 257/89 |
| 5,495,147 | A * | 2/1996 | Lanzisera | 315/185 S |
| 5,924,784 | A * | 7/1999 | Chliwnyj et al. | 362/234 |
| 5,936,599 | A * | 8/1999 | Reymond | 345/82 |
| 6,040,663 | A * | 3/2000 | Bucks et al. | 315/291 |
| 6,072,280 | A * | 6/2000 | Allen | 315/185 S |
| 6,274,924 | B1* | 8/2001 | Carey et al. | 257/676 |
| 6,344,716 | B1* | 2/2002 | Gibboney, Jr. | 315/185 S |
| 6,830,358 | B2* | 12/2004 | Allen | 362/640 |
| 7,045,965 | B2* | 5/2006 | Li et al. | 315/185 S |
| 7,053,560 | B1* | 5/2006 | Ng | 315/185 R |
| 2004/0095078 | A1* | 5/2004 | Leong | 315/291 |
| 2005/0225264 | A1* | 10/2005 | Kemp | 315/291 |
| 2005/0239227 | A1* | 10/2005 | Aanegola et al. | 438/26 |

* cited by examiner

*Primary Examiner*—Tuyet Thi Vo
(74) *Attorney, Agent, or Firm*—Troxell Law Office, PLLC

(57) ABSTRACT

An LED assembly includes a first LED unit and a second LED unit, the latter is coupled electrically to the first LED unit in such a manner that each of the first and second LED units defines a current-flow direction in reverse order so that once Alternating Current is applied, the first and second LED units are illuminated alternately by virtue of the positive and negative voltages of the Alternating Current.

19 Claims, 5 Drawing Sheets

US 7,264,381 B2

LIGHT EMITTING DIODE ASSEMBLY USING ALTERNATING CURRENT AS THE POWER SOURCE

FIELD OF THE INVENTION

The present invention relates to a light emitting diode (LED) assembly, more particularly to an LED assembly that has specific structure to use Alternating Current as the power source.

BACKGROUND OF THE INVENTION

Due to rapid advance in the manufacture technology, several types of light-production equipments have been invented, among them is an LED. The LED has a relatively small size, a considerable long service life, and swift response. In addition, since the LED consumes lesser power, requires low voltage to drive the same and is tolerable to high vibration, the use of LED is prospective day by day.

Referring to FIG. 1, a fragmentary sectional view of a conventional LED assembly is shown to include a support member 11, an LED unit 10 disposed on the support member 11, and an encapsulating body 12 covering the LED unit 10.

The LED unit 10 generally includes a support plate 101, an N-type semiconductor layer 102 disposed on the support plate 101 and a P-type semiconductor layer 103 bonded to a selected region of the N-type semiconductor layer 102 such that the semiconductor layers 102, 103 have an N-type electrode 1021 and P-type electrode 1031.

The support member 11 has positive and negative ends 111, 112. The N-type and P-type electrodes 1021, 1031 of the semiconductor layers 102, 103 are respectively and electrically connected to the negative and positive ends 111, 112 of the support member 11. The encapsulating body 12 can be made from epoxy resin and hermetically encloses the LED 10 unit therein.

When the positive and negative ends 111, 112 of the support member 11 are connected to a power source, the free electrons and the holes respectively flow into the N-type and P-type layers 102, 103 and combine together, thereby causing electrons flow between the electrodes and consequently producing visible light beams.

By virtue of an external power source and a proper biasing, the conventional LED assembly is adapted to produce light beams continuously.

As explained above, the conventional LED assembly is said to be forward biasing, i.e. the LED assembly is illuminated only when the positive cycle of current flows into the positive end 111 of the support member 11.

The power source available and existing around us is Alternating Current, which provides negative and positive cycles alternately. In case the conventional LED assembly is used as an illuminating device (such as a light bulb), an AC/DC adaptor must be employed in order to provide stable lighting effect thereof. Utilization of the adaptor can therefore results in extra expense and restricts the usage range of the conventional LED assembly.

SUMMARY OF THE INVENTION

The object of the present invention is to provide an LED assembly which can be operated by using Alternating Current without employment of an adaptor.

The other object of the present invention is to provide an LED assembly that includes at least two LED units coupled in such a manner that the same can be operated by the Alternating Current.

In one aspect of the present invention, an LED assembly is provided that uses Alternating Current as the power source. The Alternating Current provides positive voltage and negative voltage alternately. The LED assembly includes: a light emitting member including a first LED unit and a second LED unit coupled electrically to the first LED unit in such a manner that each of the first and second LED units defines a current-flow direction in reverse order so that once the Alternating Current is applied, the first and second LED units are illuminated alternately by virtue of the positive and negative voltages of the Alternating Current.

In order to achieve the enhanced specific lighting effect, the first and second LED units can be arranged to produce the light beams of the same color. In case, the light mixing effect is desired, the color of the light beams emitted by the first LED unit is not restricted to be the same as the light beams of the second LED unit.

In another aspect of the present invention, an LED assembly is provided to include: a support member, a first LED unit disposed on the support member, a second LED unit disposed on the support member and coupled electrically to the first LED unit in such a manner that each of the first and second LED units defines a current-flow direction in reverse order, and an encapsulating body mounted on the support member for hermetically covering the first and second LED units.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTIONS OF THE PREFERRED EMBODIMENTS

Figure 1:
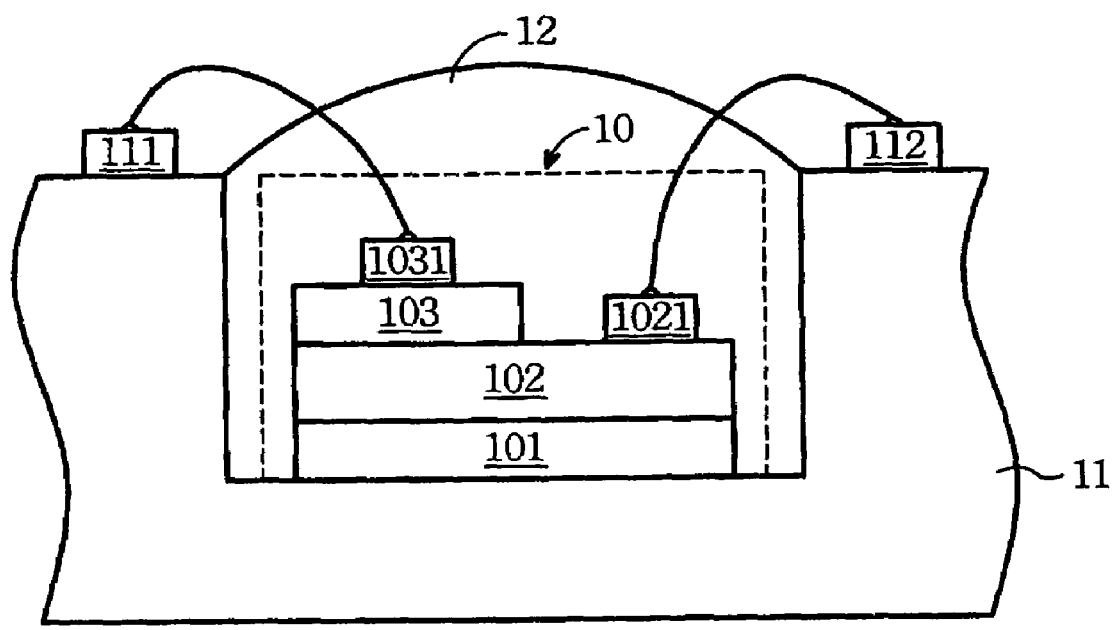
FIG. 1 is a fragmentary sectional view of a conventional LED assembly.
Figure 2:
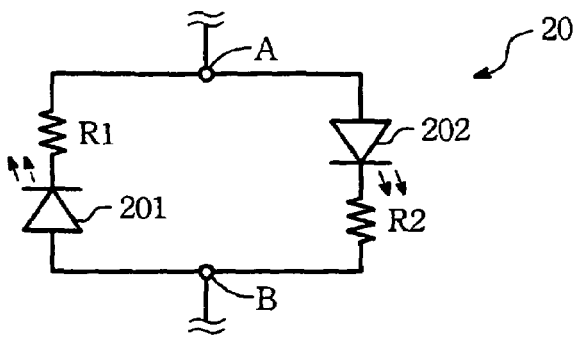
FIG. 2 is a circuit diagram representing the first embodiment of an LED assembly according to the present invention.

The LED assembly of the present invention includes at least one LED unit. However, the construction of the LED unit can be differed according to its design and requirement. FIG. 2 shows a diagram representing the circuit system of an LED assembly 20 of the present invention.

In this embodiment, the LED assembly 20 includes a first LED unit 201 and a second LED unit 202. Of course, in the other embodiment, several LED units can be added and are electrically coupled to the first and second LED units 201, 202.

In this embodiment, the Alternating Current is applied to two nodes (A, B) of the LED assembly 20 while the first and second LED units 201, 202 are coupled electrically to each other in parallel manner such that each of the first and second LED units 201, 202 defines a current-flow direction in reverse order (see circuit system of FIG. 2).

In addition, each of the first and second LED units 201, 202 is provided with a resistor R1 (R2) such that in case of a burnout in the LED assembly 20, an appropriate resistance still exists in the circuit system so as to prevent occurrence of a short circuit in the LED assembly 20. Thus, the LED assembly 20 can function continuously in the normal condition. Note that only one pair of LED units 201, 202 are employed in this embodiment. In case more than one pair of the LED units is employed in the LED assembly 20 and in case one of the LED units is ruined for some reason, the latter will provide an amount of illumination that is substantially equivalent to the initial amount of illumination.

Figure 3:
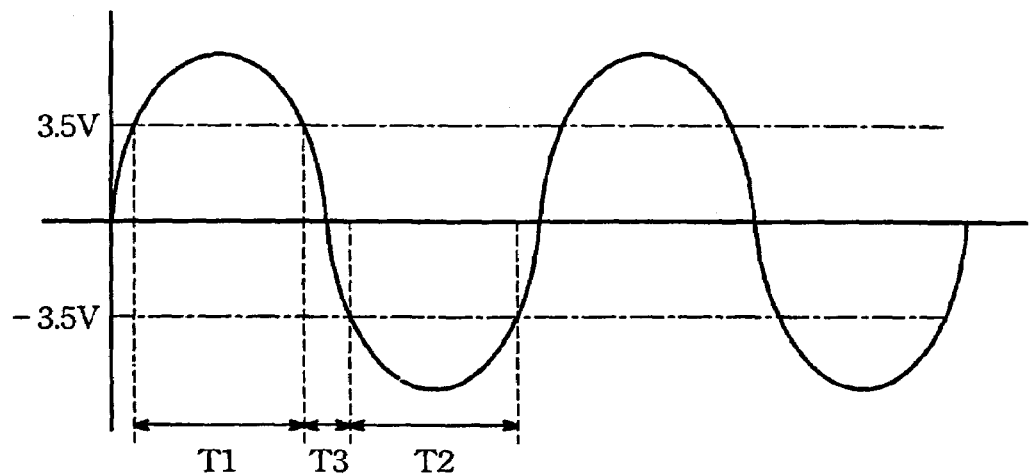
FIG. 3 shows an Alternating Current waveform that flows through the first embodiment of the LED assembly according to the present invention.

FIG. 3 illustrates a waveform when the Alternating Current is applied to the LED assembly of the present invention. In case 3.5 V Alternating Current is applied to flow into the LED assembly 20 of the present invention, the first LED unit 201 will be illuminated for a time period of T1 by the positive circle and the second LED unit 202 will be illuminated for a time period of (T2) by the negative cycle as a result of its reverse current flow with respect to the first LED unit 201, thereby providing a stable lighting effect due to ceaseless conversion of the cycles.

One thing should be emphasized is that in case an Alternating Current (such as 60 Hz) is used as the power source in this embodiment, only a relatively short transition time period (T3) is needed to convert between the positive and negative circles. Since the transition time period (T3) is so short that the human naked eyes cannot visualize the presence of the change.

In addition, in this embodiment, a higher voltage (such as 6V) is applied to the LED assembly of the present invention in order to increase the forward bias of each of the first and second LED units 201, 202. Since the duty cycle of the respective LED unit is relatively low, the high forward biasing will not affect the service life the LED assembly. The luminance level of the respective LED unit can be further increased.

Figure 4:
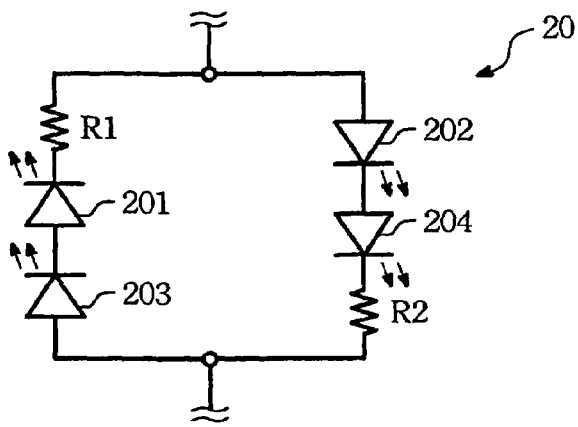
FIG. 4 is a circuit diagram representing the second embodiment of an LED assembly according to the present invention.

Referring to FIG. 4, a circuit system representing the LED units in another embodiment of the LED assembly of the present invention is shown to have the construction similar to that of the first embodiment. The only difference resides in that a third LED unit 203 and a fourth LED unit 204 are coupled electrically and respectively to the first and second LED units 201, 202 in series configuration.

In this embodiment, in order to achieve the specific color beams of luminance strength level, the third and fourth LED units 203, 204 can be arranged to produce light beams having color similar to that of the first LED unit 201 or the second LED unit 202. In another embodiment, in order to provide color-mixing effect of the LED assembly of the present invention, the third or fourth LED unit 203, 204 may have specific color, not specifically the same as the first or second LED unit 201, 202. The third LED unit 203 may produce light beams different from that of the fourth LED unit 204. The color difference of the light beams produced by the respective LED unit allows the LED assembly of the present invention to be employed at different worksites and at different purposes.

In addition, the first and second LED units 201, 202 can be arranged in such a manner so as to be enclosed hermetically within two individual encapsulating bodies (not shown) having different structures. The first and second LED units 201, 202 are coupled to each other in the aforesaid manner to produce light alternately. In the same manner, in case the LED assembly of the present invention includes third and fourth LED units 203, 204, the latter can be enclosed hermetically within individual encapsulating bodies (not shown).

Practically speaking, during manufacture of the LED assembly of the present invention, the first and second LED units 201, 202 should be enclosed hermetically within a single encapsulating body (not shown) in order to reduce the production cost, and so as to provide a compact size thereof. Alternately, by increasing the number of LED units enclosed within an individual encapsulating body, the light-production ability of the LED assembly of the present invention can be enhanced.

Figure 5A:
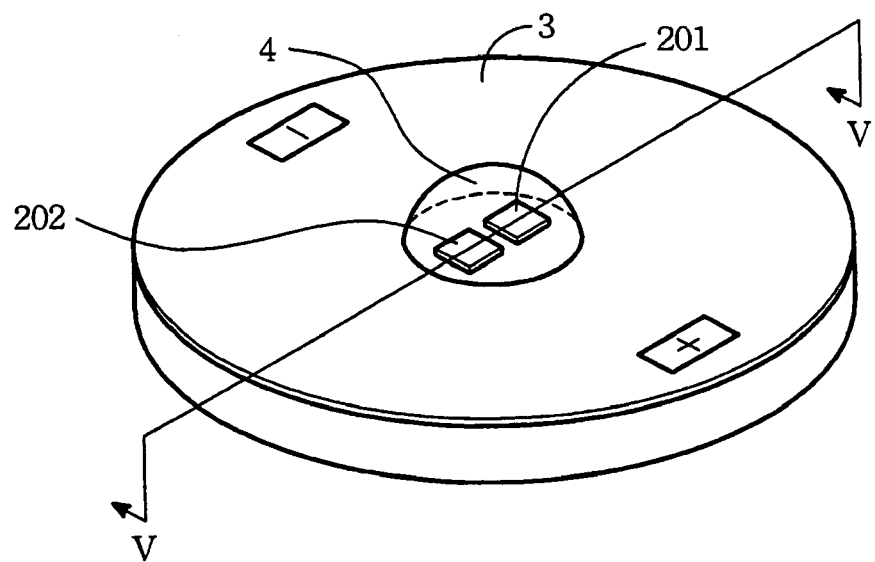
FIGS. 5A and 5B illustrate perspective and exploded sectional views of the first embodiment of the LED assembly according to the present invention.

FIG. 5A illustrates one embodiment of the LED assembly of the present invention. The LED assembly includes a support member 3, a first LED unit 201, a second LED unit 202 and an encapsulating body 4.

The first and second LED units 201, 202 are mounted on the support member 3.

The second LED unit 202 is coupled to the first LED unit 201 in the reverse order. The encapsulating body 4 is mounted on the support member 3 in such a manner to enclose hermetically the first and second LED units 201, 202 therein.

Figure 5B:
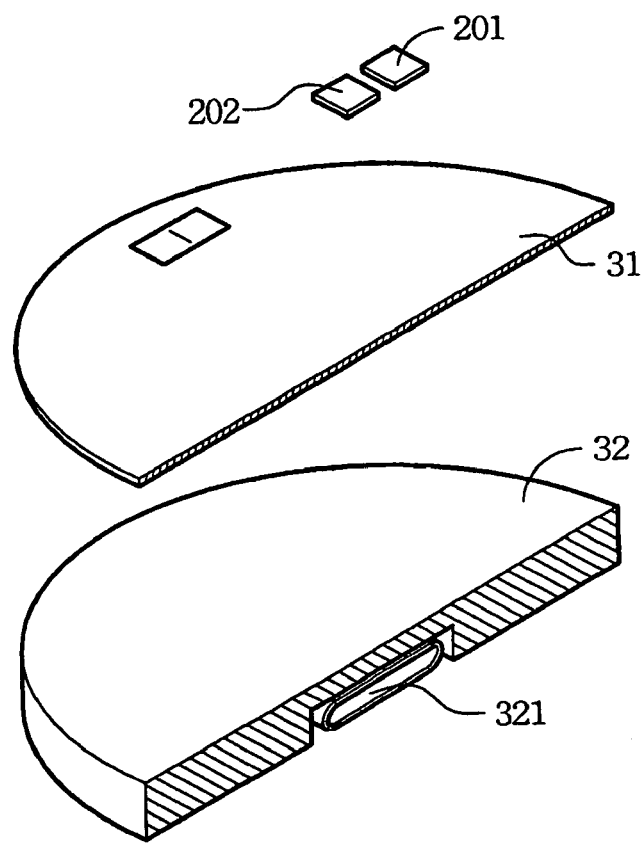

FIG. 5B indicates sectional views of the support member 3 taken along lines V-V in FIG. 5A and includes a disc-shaped bottom plate 32 and a disc-shaped upper plate 31 stacked over the bottom plate 32. The first and second LED units 201, 202 are mounted on the upper plate 31.

The bottom plate 32 has a lower section defining a hollow heat-dissipating tube 321 that extends in a radial direction and that is filled with an operating fluid. By virtue of circulation of the operating fluid, the intensive heat generated by the first and second LED units 201, 202 during the operation thereof is guided toward the exterior of the LED assembly, thereby prolonging the service life of the LED assembly of the present invention.

Figure 6A:
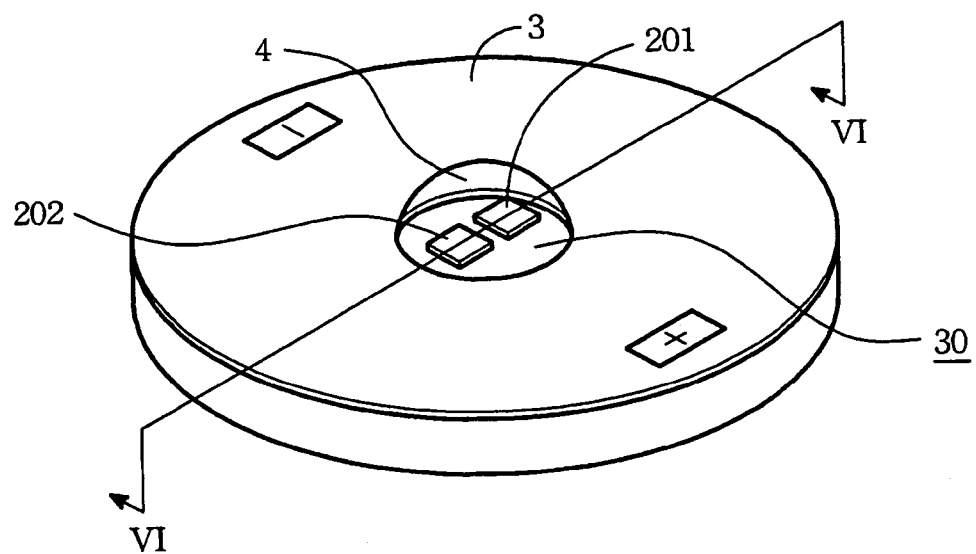
FIGS. 6A and 6B illustrate perspective, exploded and sectional views of the second embodiment of the LED assembly according to the present invention.
Figure 6B:
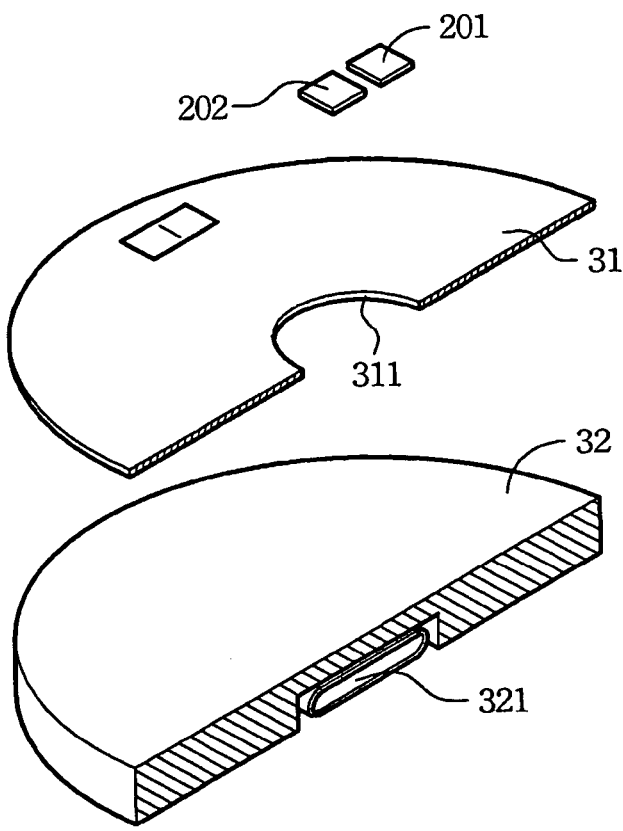

FIGS. 6A and 6B illustrate another embodiment of the present invention wherein the latter indicates sectional views of the support plate 3 taken along lines VI-VI in FIG. 6A. The support member 3 is formed with a recess 30. The first and second LED units 201, 202 are disposed within the recess 30.

The support member 3 includes upper and lower plates 31, 32 The upper plate 31 has a through hole 311 defined by an inner peripheral wall. The through hole 311 serves as the recess 30 to receive the first and second LED units 201, 202 therein. Under this condition, the upper surface of the bottom plate 32 serves as a bottom sidewall of the recess 30. The first and second LED units 201, 202 are disposed within the recess 30, hence on the upper surface of the lower plate 32 (on the heat-dissipating tube 321) so as to enhance the heat dissipation effect.

In addition, an LED system of the present invention can be established utilizing an LED assembly 20 as explained in the above. Though a single LED assembly 20 can provide illumination effect, several LED assemblies can be employed if we desire to produce a preferable level of illumination. In order to fit the different designs, the arrangement and connection among the LED assemblies 20 can be adjusted.

Figure 7:
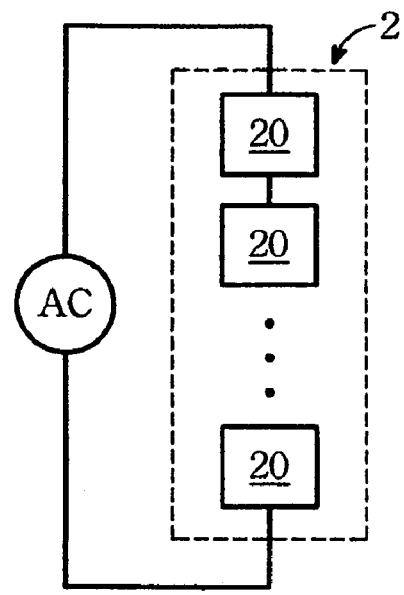
FIG. 7 is a block diagram illustrating how a plurality of LED units are coupled to the Alternating Current in one embodiment of the present invention.

FIG. 7 illustrates a circuit diagram representing one embodiment of the LED system 2 of the present invention, wherein the system is coupled to the AC current source. There may be more than three LED units 20 which are connected in series configuration with the condition as stated above. When Alternating Current is applied to the embodiment, the respective LED unit 20 is lit up by virtue of conversion of the negative and positive cycles without employment of an adaptor or converter.

Figure 8:
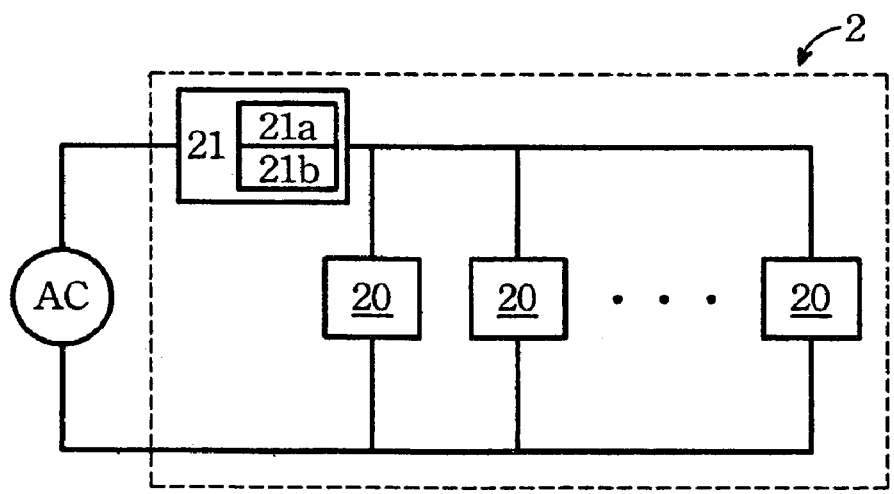
FIG. 8 is a block diagram illustrating how a plurality of LED units are coupled to the Alternating Current in anther embodiment of the present invention.

FIG. 8 illustrates a circuit diagram representing one embodiment of the LED system 2 of the present invention, wherein the system 2 further includes a control circuit 21 for coupling the LED units 20 in different manner.

As shown in FIG. 8, the LED units 20 are connected in parallel configuration under the aforesaid the condition and the AC current is applied to the LED units 20. The control circuit 21 is used for executing and controlling the voltage level, frequency range, and resistance thereof. The control circuit 21 may include electronic components depending on utility of the system 2.

For example, the control circuit 21 may include a transformer 21a for regulating voltage of a respective one of the LED units 201, 202 (such as lowering the voltage of the AC to 3V as required by the respective LED unit). Alternatively, the control circuit 21 may include voltage resistor for lowering the applied voltage in addition to prevent untimely burnout of the respective LED unit 20 due to overflow current passing therethrough. The control circuit 21 can further include a frequency converter 21b for converting frequency of the current flowing into the respective LED unit 20 so as to reduce the heat generated thereby. Of course, in the embodiment shown in FIG. 7, several electronic components can be added into the control circuit 21 based on the design of the system 2 so as to produce the most enhanced illumination. The LED units 20 can be coupled in series or parallel configuration or in a combination including the series and parallel connection, a detail of such arrangement is omitted herein.

In summary, the following advantages can be achieved by the LED assembly or system of the present invention; the manufacture cost of the LED assembly is cheap since no AC/DC adaptor is required by virtue of the specific arrangement of the LED units when compared to that of the conventional LED assembly. Only little power is lost in the transition of the positive and negative circles in the Alternating Current, thereby providing a means of efficient illumination.

In addition, in one embodiment of the present invention, an appropriate number of LED units is coupled to one another in the reverse order and is positioned on the support member 3. The service life of the LED assembly of the present invention can be prolonged since the heat-dissipating tube of the support member 3 can effectively dissipate heat generated during operation thereof.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. An LED assembly using Alternating Current as the power source, the Alternating Current providing positive voltage and negative voltage alternately, the LED assembly comprising:

a light emitting member including a first LED unit, and a second LED unit coupled electrically to said first LED unit in such a manner that each of said first and second LED units defines a current-flow direction in reverse order so that once the Alternating Current is applied, said first and second LED units are illuminated alternately by virtue of the positive and negative voltages of the Alternating Current; and a support member including a bottom plate and an upper plate stacked over said bottom plate, said upper plate having an upper surface formed with a recess to permit seating of said first and second LED units therein, said bottom plate being disc-shaped and having a lower section defining a heat-dissipating tube.

2. The LED assembly according to claim 1, further comprising a control circuit including a resistor to prevent burn out of each of said first and second LED units.

3. The LED assembly according to claim 1, further comprising a control circuit including a transformer for regulating undervoltage and overvoltage conditions of a respective one of said first and second LED units.

4. The LED assembly according to claim 1, further comprising a control circuit including a frequency converter for converting frequency of the current flowing into a respective one of said first and second LED units.

5. The LED assembly according to claim 1, wherein said heat-dissipating tube extends in a radial direction thereof.

6. The LED assembly according to claim 1, further comprising a resistor coupled to said first LED unit.

7. The LED assembly according to claim 1, further comprising a resistor coupled to said second LED unit.

8. The LED assembly according to claim 1, wherein each of said first and second LED units is constructed in such a manner to emit light beams of specific color.

9. The LED assembly according to claim 1, further comprising a third LED unit capable of emitting light beams of specific color different from or the same as that of said first and second LED units.

10. The LED assembly according to claim 1, further comprising a third LED unit and a fourth LED unit which are coupled electrically and respectively to said first and second LED units in series, said third and fourth LED units capable of emitting light beams of specific color different from or the same as that of said first and second LED units.

11. The LED assembly according to claim 1, further comprising an encapsulating body enclosing hermitically said first and second LED units onto said support member.

12. The LED assembly according to claim 11, wherein said encapsulating body is disposed on said support member for hermetically covering said first and second LED units within said recess in said support member.

13. An LED, assembly comprising:

a support member including a bottom plate and an upper plate stacked over said bottom plate, said upper plate having an upper surface formed with a recess, said bottom plate being disc-shaped and having a lower section defining a heat-dissipating tube;

a first LED unit disposed within said recess in said upper plate;

a second LED unit disposed within said recess in said upper plate and coupled electrically to said first LED unit in such a manner that each of said first and second LED units defines a current-flow direction in reverse order; and an encapsulating body mounted on said support member for covering said first and second LED units.

14. The LED assembly according to claim 13, wherein said heat-dissipating tube extends in a radial direction thereof.

15. The LED assembly according to claim 13, further comprising a resistor coupled to said first LED unit.

16. The LED assembly according to claim 13, further comprising a resistor coupled to said second LED unit.

17. The LED assembly according to claim 13, wherein each of said first and second LED units is constructed in such a manner to emit light beams of specific color.

18. The LED assembly according to claim 13, further comprising a third LED unit capable of emitting light beams of specific color different from or the same as that of said first and second LED units.

19. The LED assembly according to claim 13, further comprising a third LED unit and a fourth LED unit which are coupled electrically and respectively to said first and second LED units in series, said third and fourth LED units capable of emitting light beams of specific color different from or the same as that of said first and second LED units.

* * * * *